US009714984B2

(12) United States Patent
Kim

(10) Patent No.: US 9,714,984 B2
(45) Date of Patent: Jul. 25, 2017

(54) APPARATUS AND METHOD FOR ESTIMATING STATE OF HEALTH OF VEHICLE BATTERY

(71) Applicant: HYUNDAI MOBIS CO., LTD., Seoul (KR)

(72) Inventor: Tae-Kwon Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 112 days.

(21) Appl. No.: 14/645,893

(22) Filed: Mar. 12, 2015

(65) Prior Publication Data

US 2015/0268309 A1    Sep. 24, 2015

(30) Foreign Application Priority Data

Mar. 20, 2014  (KR) .................. 10-2014-0032636

(51) Int. Cl.
*G01N 27/416*   (2006.01)
*G01R 31/36*    (2006.01)

(52) U.S. Cl.
CPC ........ *G01R 31/3679* (2013.01); *G01R 31/361* (2013.01); *G01R 31/3651* (2013.01); *G01R 31/3675* (2013.01)

(58) Field of Classification Search
CPC .... G01N 31/02; H01M 10/484; H01M 10/48; G01R 31/3658; Y02E 60/12
USPC ....................................................... 324/432
See application file for complete search history.

(56) References Cited

U.S. PATENT DOCUMENTS

| 7,928,735 B2 * | 4/2011 | Huang ............... B60L 11/1857 320/132 |
| 2003/0052647 A1 * | 3/2003 | Yoshida ............... B60L 3/0046 320/125 |
| 2006/0152196 A1 * | 7/2006 | Matsumoto .......... H02J 7/0029 320/132 |
| 2007/0001679 A1 * | 1/2007 | Cho, II ............. G01R 31/3679 324/426 |
| 2014/0236511 A1 * | 8/2014 | Kulkarni ............. G01R 31/362 702/63 |

FOREIGN PATENT DOCUMENTS

| KR | 10-2007-0043150 A | 4/2007 |
| KR | 10-2013-0064308 A | 6/2013 |

* cited by examiner

*Primary Examiner* — Arun Williams
(74) *Attorney, Agent, or Firm* — Knobbe Martens Olson & Bear LLP

(57) ABSTRACT

An apparatus for estimating a deterioration may include a battery pack, a state information sensing unit configured to sense a state of the battery pack to generate state information, a conversion operation unit configured to convert into an open circuit voltage (OCV) using the generated state information and estimate a state of charge (SOC) using the converted OCV, a first SOH estimation operation unit configured to estimate a first state of charge (SOH) using the estimated SOC, a battery aging factor calculation unit configured to calculate a battery aging factor using the estimated SOC, a second SOH operation unit configured to apply the calculated battery aging factor to a preset lookup table to calculate a second SOH, and a filtering unit configured to filter the first SOH and the second SOH to generate a final SOH.

18 Claims, 9 Drawing Sheets

APPARATUS AND METHOD FOR ESTIMATING STATE OF HEALTH OF VEHICLE BATTERY

CROSS-REFERENCE(S) TO RELATED APPLICATION(S)

This application claims the benefit of priority to Korean Patent Application No(s). 10-2014-0032636 filed on Mar. 20, 2014 the entire contents of which are incorporated herein by reference.

BACKGROUND

Field

Embodiments of the present invention relate to a battery, and more particularly, to an apparatus and a method for estimating a deterioration of a battery pack.

Description of Related Art

An electric vehicle (EV), a plug-in hybrid electric vehicle (PHEV), or the like is equipped with a high voltage battery for storing electric energy which is provided as a driving force of a vehicle. Here, a mileage of the electric vehicle or the plug-in hybrid electric vehicle is absolutely affected by a capacity or a state of the high voltage battery.

However, when the battery is continuously used due to characteristics of the battery, the battery may not avoid a phenomenon of a reduction in capacity called deterioration. When the battery aging is continued, even though the same state of charge (SOC) quantity is displayed, a phenomenon of a mileage reduction, an output reduction for acceleration and the like appears. When the phenomenon is not properly detected, customer complaints may be lodged in a state in which causes are unclear.

Korean Patent Laid-Open Publication No. 10-2013-0064308 (Title: Degradation Estimation Method For High Voltage Battery Of Vehicle) discloses a degradation estimation method.

SUMMARY

An embodiment of the present invention is directed to an apparatus and a method for estimating a deterioration of a battery pack which does not require a large amount of test results to table a change rate of charging capacity to a change in battery voltage.

Another embodiment of the present invention is directed to an apparatus and a method for estimating a deterioration of a battery pack with no errors when a behavior of a change rate of charging capacity depending on a change in battery voltage is different from a table.

Other aspects and advantages of the present invention can be understood by the following description, and become apparent with reference to the embodiments of the present invention. Also, it is obvious to those skilled in the art to which the present invention pertains that the aspects and advantages of the present invention can be realized by the means as claimed and combinations thereof.

In accordance with an embodiment of the present invention, an apparatus for estimating a deterioration includes: a battery pack; a state information sensing unit configured to sense a state of the battery pack to generate state information; a conversion operation unit configured to convert into an open circuit voltage (OCV) using the generated state information and estimate a state of charge (SOC) using the converted OCV; a first SOH estimation operation unit configured to estimate a first state of charge (SOH) using the estimated SOC; a battery aging factor calculation unit configured to calculate a battery aging factor using the estimated SOC; a second SOH operation unit configured to apply the calculated battery aging factor to a preset lookup table to calculate a second SOH; and a filtering unit configured to filter the first SOH and the second SOH to generate a final SOH.

The state information may include voltage, temperature, and current.

The SOC may be estimated by converting the OCV into the SOC using a preset SOC-OCV lookup table.

The SOC may be estimated by converting the OCV into the SOC using a coulomb counting scheme and the coulomb counting scheme may represent a value obtained by integrating a current value input by a unit time and then dividing the integrated current value by the total battery capacity as an SOC value fluctuated for a unit time.

The first estimation operation unit may primarily estimate the SOH using a charge transfer and an SOC change value for a predetermined time by using a change in the SOC value depending on a current behavior at the time of charging and discharging of the battery pack.

The first estimation operation unit may calculate the first SOH by assigning a threshold condition to the primarily estimated SOH and applying a least mean square scheme to the SOH satisfying the threshold condition.

The first SOH may be estimated by being divided by an initial battery capacity at a linear slope calculated by the least mean square scheme to be obtained as a percentage.

The preset lookup table may be an SOH lookup table for each SOC section.

The final SOH may be calculated by Equation FINAL SOH=A×$SOH_{OPERATION}$+(1−A)×$SOH_{table}$ Here, the $SOH_{operation}$ represents the first SOH, $SOH_{table}$ represents the second SOH, and A value represents a value changed depending on temperature).

The A value may be values which are tabulated by a database storing temperature information through experiments.

In accordance with another embodiment of the present invention, a method for estimating a deterioration of a battery pack includes: sensing a state of the battery pack to generate state information; converting into an open circuit voltage (OCV) using the generated state information and estimating a state of charge (SOH) using the converted OCV; estimating a first state of charge (SOH) using the estimated SOC; calculating a battery aging factor using the estimated SOC; applying the calculated battery aging factor to a preset lookup table to calculate a second SOH; and filtering the first SOH and the second SOH to generate a final SOH.

In the estimating of the first state of charge, the SOH may be primarily estimated using a charge transfer and an SOC change value for a predetermined time by using a change in the SOC value depending on a current behavior at the time of charging and discharging of the battery pack.

In the first state of charge, the first SOH may be calculated by assigning a threshold condition to the primarily estimated SOH and applying a least mean square scheme to the SOH satisfying the threshold condition.

DESCRIPTION OF EMBODIMENTS

Figure 1:
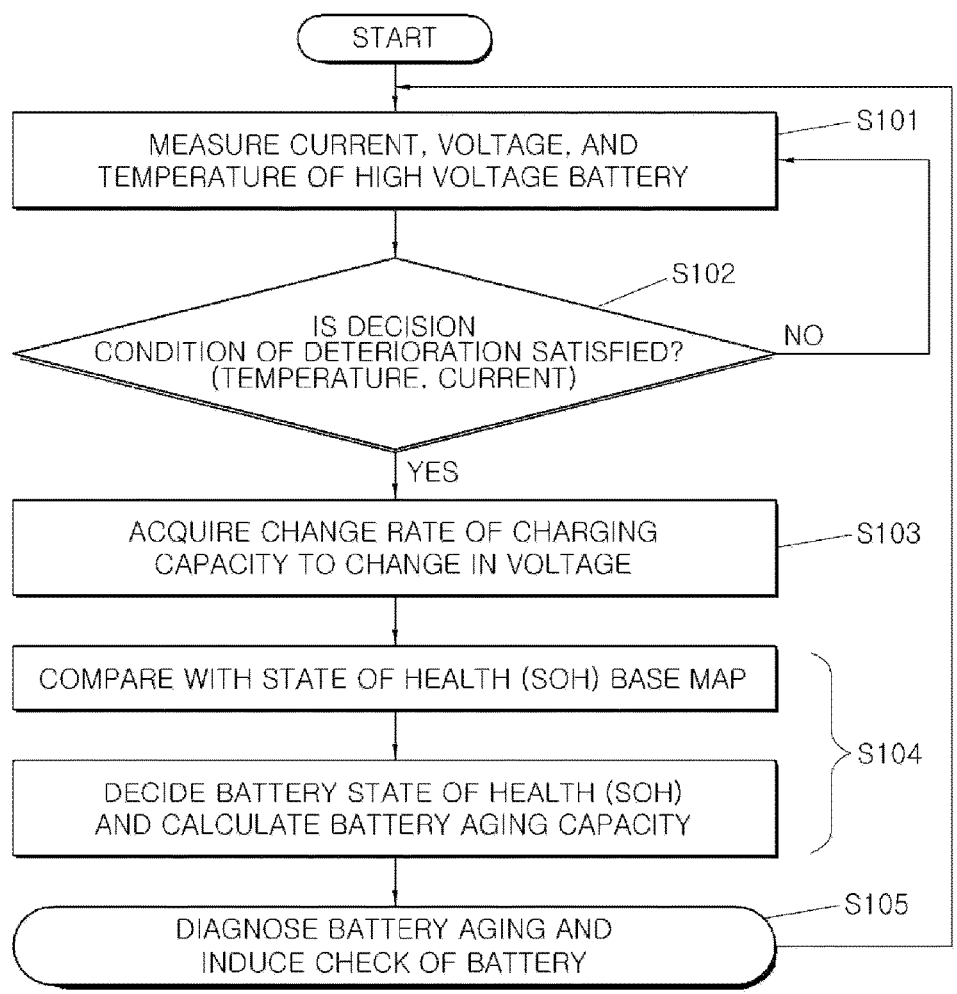
FIG. 1 is a flow chart illustrating a decision of aging of a high voltage battery which is equipped in a general vehicle.

Since the present invention may be variously modified and have several embodiments, specific embodiments will be shown in the accompanying drawings and be described in detail. However, it is to be understood that the present invention is not limited to the specific embodiments, but includes all modifications, equivalents, and substitutions included in the spirit and the scope of the present invention.

Throughout the accompanying drawings, the same reference numerals will be used to describe the same components.

Terms used in the specification, 'first', 'second', etc., may be used to describe various components, but the components are not to be interpreted to be limited to the terms. The terms are used to distinguish one component from another component.

Therefore, the first component may be referred to as the second component, and the second component may be referred to as the first component. The term 'and/or' includes a combination of a plurality of items or any one of a plurality of terms.

Unless indicated otherwise, it is to be understood that all the terms used in the specification including technical and scientific terms have the same meaning as those that are understood by those who skilled in the art.

It must be understood that the terms defined by the dictionary are identical with the meanings within the context of the related art, and they should not be ideally or excessively formally defined unless the context clearly dictates otherwise.

Hereinafter, an apparatus and a method for estimating a deterioration of a battery pack in accordance with embodiments of the present invention will be described with reference to the accompanying drawings.

Referring to FIG. 1, a change rate of charging capacity to a small change in voltage at the time of charging the high voltage battery is tabulated to compare a state of health of charging capacity with the change in voltage, thereby diagnosing the battery aging (steps S101~S105).

However, according to the above method, many test results are required to table the change rate in charging capacity to the change in battery voltage.

Further, when a behavior of the change rate in charging capacity to the change in battery voltage is different from the table, errors may occur.

Figure 2:
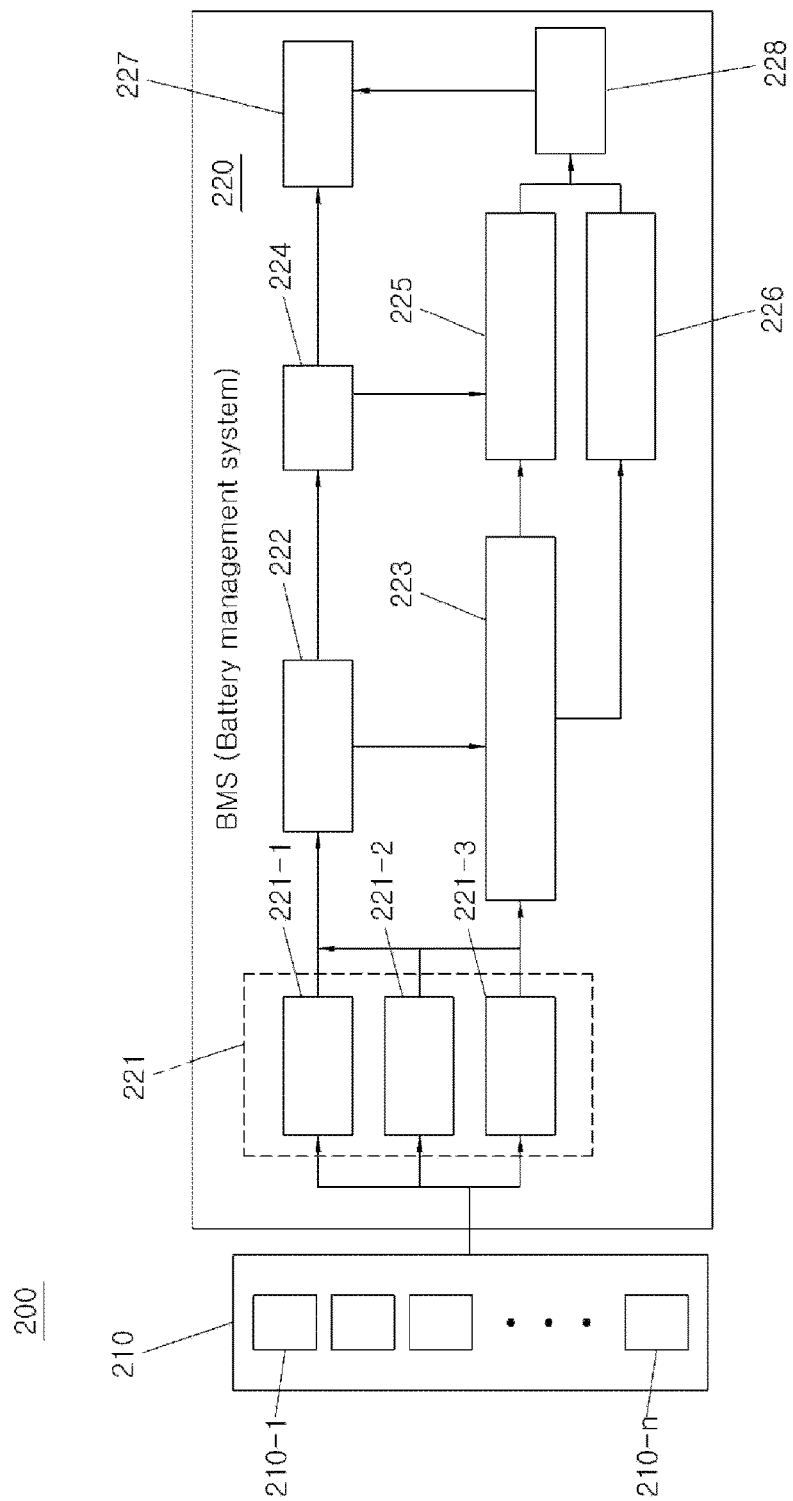
FIG. 2 is a configuration diagram of an apparatus for estimating a deterioration of a battery pack in accordance with an embodiment of the present invention.

FIG. 2 is a configuration diagram of an apparatus 200 for estimating a deterioration of a battery pack in accordance with an embodiment of the present invention. Referring to FIG. 2, the apparatus 200 for estimating a deterioration of a battery pack includes a battery pack 210 and a battery management system (BMS) 220 configured to estimate the deterioration of the battery pack using state information of the battery pack 210, and the like.

The BMS 220 includes a state information sensing unit 221 configured to generate the state information of the battery pack 210, a conversion operation unit 222 configured to convert into an open circuit voltage (OCV) using the sensed state information, an estimation unit 224 configured to estimate a state of charge (SOC) using the converted OCV, a first SOH estimation operation unit 225 configured to estimate a first state of charge (SOH) using the estimated SOC, a battery aging factor calculation unit 223 configured to calculate a battery aging factor using the estimated SOC, a second SOH calculation unit 226 configured to calculate a second SOH by applying the calculated battery aging factor to a preset lookup table, a filtering unit 228 configured to filter the first SOH and the second SOH to generate a final SOH, a controller 227 configured to control the above components, and the like.

The battery pack 210 is configured of battery cells 210-1 to 210-$n$ which are connected in series and/or in parallel, in which the battery cell may be a high voltage battery for an electric vehicle such as a nickel metal battery, or a lithium ion battery. Generally, the high voltage battery is a battery used as a power source which moves the electric vehicle, which means a high voltage battery of 100 V or more. However, the embodiment of the present invention is not limited thereto, and therefore a low voltage battery may be used.

Herein, an example of the electric vehicle may include an electric vehicle (EV), a hybrid electric vehicle (HEV), a plug-in hybrid electric vehicle (PHEV), a fuel cell vehicle, and the like.

The state information sensing unit 221 includes a voltage sensing unit 221-1 configured to sense a voltage of the battery pack 210, a temperature sensing unit 221-2 configured to sense a temperature, a current sensing unit 221-3 configured to sense a current, and the like.

Further, FIG. 2 separately illustrates the conversion operation unit 222 configured to convert into the OCV using the state information generated by the state information sensing unit 221 and the estimation unit 224 configured to estimate the SOC using the converted OCV, but is not limited thereto. That is, the conversion operation unit 222 and the estimation unit 224 may be unified to be configured as one module.

Successively, the OCV conversion operation which is performed in the conversion operation unit 222 will be described with reference to FIG. 2. An internal resistance of the battery is calculated by the following Equation based on Ohm's law.

$$\text{RESISTANCE}(R) = \frac{V(n) - V(n-1)}{I(n) - I(n-1)} = \frac{\Delta V}{\Delta I} \qquad \text{[Equation 1]}$$

Here, when the resistance R satisfies a threshold value of current I, the resistance R is updated (I(n)<threshold current value 1, ΔI<threshold current value 2)

The OCV is calculated the following Equation 2 using the calculated resistance value.

$$OCV(n)=V(n)-I(n)R \qquad \text{[Equation 2]}$$

Here, V(n)=instant voltage at n time, I(n)=instant current at n time, and R=internal resistance of a battery.

When a current value is equal to or less than a threshold current value, the measured voltage value is handled as the OCV value.

Figure 4:
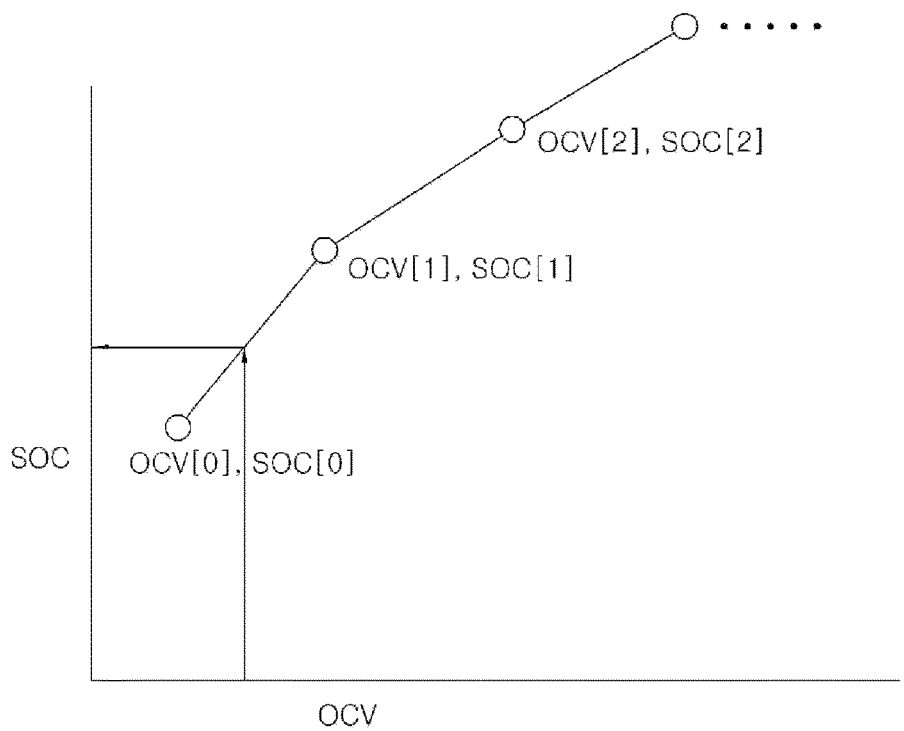
FIG. 4 is a graph illustrating a conversion of an open circuit voltage (OCV) into a state of charge (SOC) based on an open circuit voltage (OCV) table in accordance with an embodiment of the present invention.

Next, the SOC estimation which is performed by the estimation unit 224 using a state of charge (SOC)-open circuit voltage (OCV) lookup table is as follows:

The SOC is estimated by converting the OCV value calculated by the conversion operation unit 222 into the SOC based on the SOC-OCV table of a unit of SOC 5% in consideration of temperature. This example is shown in FIG. 4. Matters of FIG. 4 will be described below.

Referring continuously to FIG. 2, in the case of I(n)>threshold current value 1, ΔI>threshold current value 2, the SOC is estimated using a coulomb counting scheme as another scheme. The coulomb counting scheme is defined by the following Equation 3.

$$SOC(n) = SOC(n-1) + \frac{\int_{n+1}^{n} I dt}{C} \qquad \text{[Equation 3]}$$

Here, I: current (A), t: time (s), and C: battery capacity (Ah=3600 As).

A value obtained by integrating a current value input by a unit time and then dividing the integrated current value by the total battery capacity represents the SOC value fluctuated for a unit time. Therefore, an n-th SOC value is estimated by adding an instantly changed SOC value to an n−1-th SOC (n−1).

To be continued, a calculation of the battery aging factor which is performed by the battery aging factor (AF) calculation unit 223 will be described with reference to FIG. 2.

Figure 5:
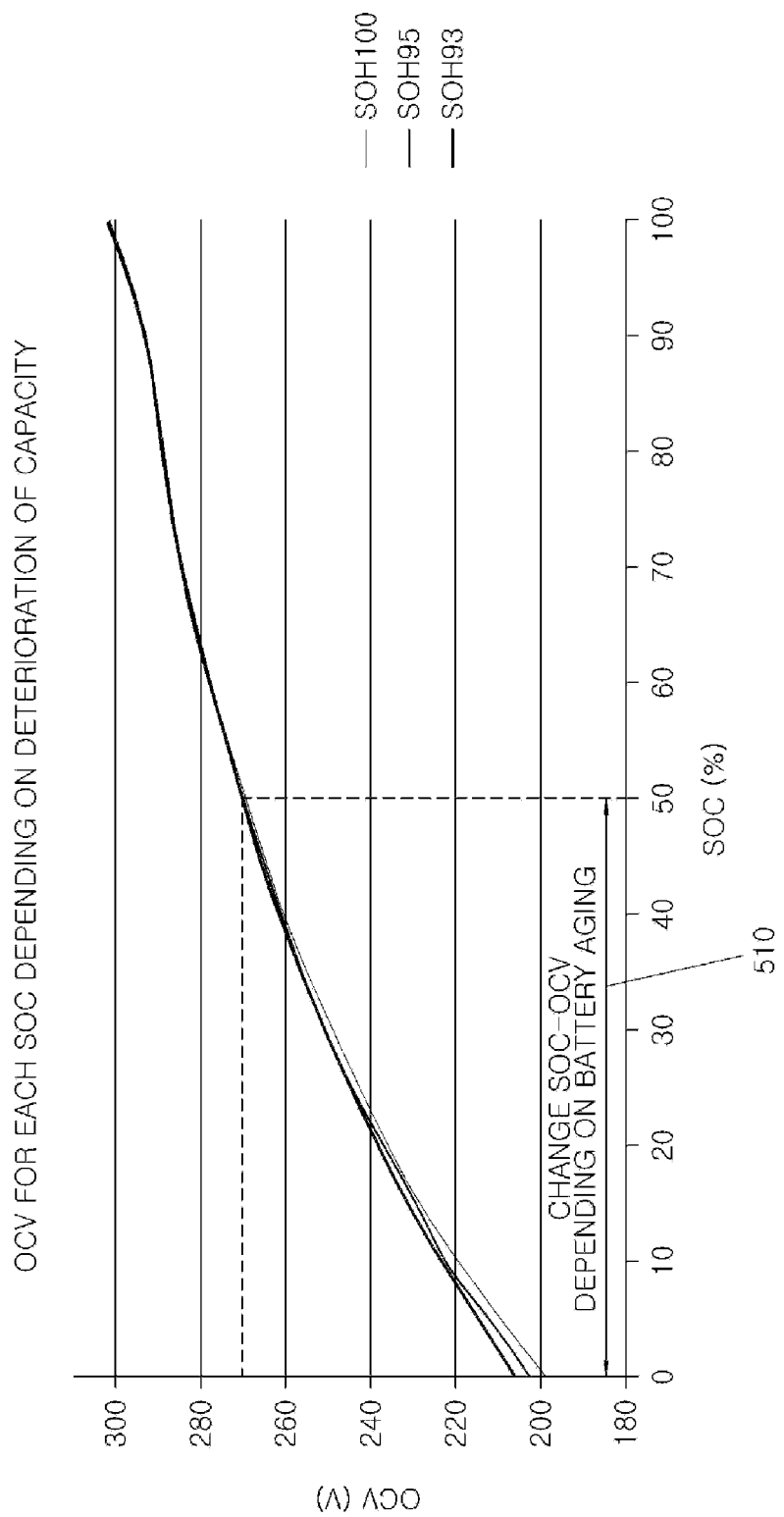
FIG. 5 is a graph illustrating an OCV value which is changed in a specific SOC section depending on a deterioration of capacity in accordance with an embodiment of the present invention.
Figure 6:
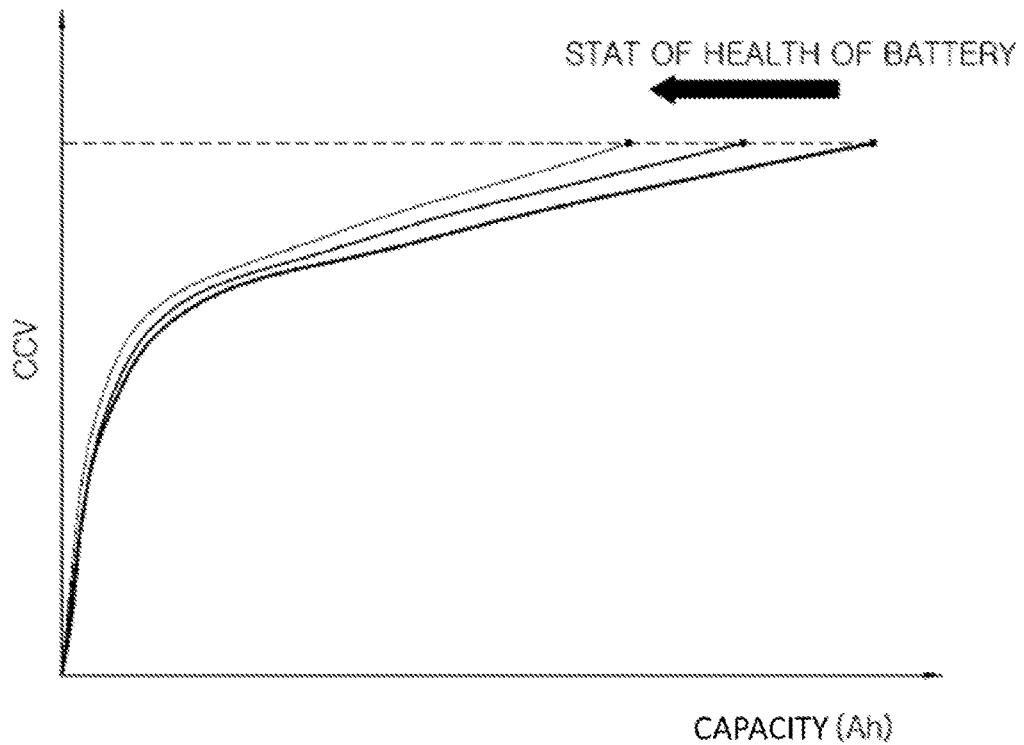
FIG. 6 is a graph illustrating variables of a deterioration of a battery which are defined in an SOC-OCV variable section in accordance with an embodiment of the present invention.

A graph illustrating OCV characteristics for each SOC depending on a deterioration of capacity is illustrated in FIG. 5. When the battery aging occurs, the OCV value of the battery is changed in a specific SOC section. Therefore, the battery aging factor may be defined as illustrated in FIG. 6 in the SOC-OCV variable section 510 due to the battery aging.

Referring continuously to FIG. 2, the battery aging factor calculation unit 223 calculates the battery aging factor (AF) using the following Equation 4.

$$AF=(\Delta OCV)/(\int Idt)=(\text{OCV CHANGE QUANTITY})/(\text{TOTAL CHARGE TRANSFER}) \qquad \text{[Equation 4]}$$

The first estimation operation unit 225 primarily estimates the SOH using a charge transfer and an SOC change value for a predetermined time by using the change in the SOC value depending on a current behavior at the time of charging and discharging. A coulomb counting equation of the battery state of charge (SOC) is as follows.

$$SOC(n) = SOC(n-1) + \frac{i\Delta T}{C} \qquad \text{[Equation 5]}$$

Here, I: current (A), ΔT: current applying time (s), and C: battery capacity (Ah).

The battery capacity for the change in the SOC and the change in the charge transfer is calculated using the coulomb counting equation in the charging state.

$$C' = \frac{\sum_{k=n1}^{n2} i(k)\Delta T}{SOC(n2) - SOC(n1)} \qquad \text{[Equation 6]}$$

The SOH is estimated by being calculated as a percentage after dividing the calculated battery capacity by initial battery capacity. This will be represented by the following Equation.

$$SOH = \frac{C'}{C} \times 100 \qquad \text{[Equation 7]}$$

A denominator value needs to be a threshold value or more in consideration of the errors of the SOC. In other words, the higher the threshold value, the better the accuracy but the longer the update time. The threshold value is determined in consideration of an SOC available area.

Referring to FIG. 2, the first estimation operation unit 225 secondarily applies the corresponding charge transfer and SOC value to the SOH value which is satisfied by assigning a threshold condition to the SOH estimated by the primary estimation operation and substituting it into a least mean square equation to minimize the errors of the SOH.

That is, the aged battery capacity C' is calculated using the least mean square scheme as the following Equation.

$$C' = \frac{\sum_{k=n1}^{n2} i(k)\Delta T}{SOC(n2) - SOC(n1)} = \frac{chargeTransfer}{\Delta SOC} = \frac{y}{x} \qquad \text{[Equation 8]}$$

In other words, in a linear equation f(x)=ax+b by the least mean square scheme, an error of coordinate values $y_i$ of each point $x_i$ and a function value $f(x_i)$ corresponds to a case in which a sum of a square of $y_i-f(x_i)=y_i-(ax_i+b)$ is minimized.

This will be represented by the following Equation.

$$E(a, b) = \sum_{i=1}^{n} (y_i - (ax_i + b))^2 \qquad \text{[Equation 9]}$$

To make E(a, b) a highest value, partial differential values ∂E/∂a and ∂E/∂b needs to be 0. This will be represented by the following Equation.

$$\begin{cases} 0 = \frac{\partial E}{\partial a} = \sum 2(y_i - ax_i - b)(-x_i) = 2\left(\dfrac{a\sum x_i^2 + b\sum x_i -}{\sum x_i y_i}\right) \\ 0 = \frac{\partial E}{\partial a} = \sum 2(y_i - ax_i - b)(-1) = 2\left(\dfrac{a\sum x_i + b\sum 1 -}{\sum y_i}\right) \end{cases} \qquad \text{[Equation 10]}$$

-continued $$(*)\begin{cases} a\sum x_i^2 + b\sum x_i = \sum x_i y_i \\ a\sum x_i^2 + b\sum x_i = \sum x_i y_i \end{cases}$$ [Equation 11]

$$\Longrightarrow \begin{bmatrix} \sum x_i^2 & \sum x_i \\ \sum x_i & \sum 1 \end{bmatrix}\begin{bmatrix} a \\ b \end{bmatrix} = \begin{bmatrix} \sum x_i y_i \\ \sum y_i \end{bmatrix}$$

Since a y intercept value of a charge transfer linear equation to ASOC is 0, b=0. Therefore, it may be arranged by the following Equation.

$$\therefore C' = \text{SLOPE OF LINEAR EQUATION}(\alpha) = \quad \text{[Equation 12]}$$

$$\frac{\sum x_i y_i}{\sum x_j^2} = \frac{\sum \Delta SOC \times \text{CHARGE TRANSFER}}{\sum \Delta SOC^2}$$

Therefore, the SOH may be estimated by being divided by the initial battery capacity at a linear slope to be obtained as a percentage.

$$SOH = \frac{C'}{C} \times 100 \quad \text{[Equation 13]}$$

Here, C represents the initial battery capacity.

Referring continuously to FIG. 2, the second estimation operation unit 226 applies the SOH lookup table for each SOC section using the battery aging factor (AF) value to estimate the SOH. This will be described below with reference to FIG. 8.

Referring continuously to FIG. 2, the filtering unit 228 applies a proper ratio of a first SOH value which is operated and estimated by the first estimation operation unit 225 and a second SOH value which is operated and estimated by the second estimation operation unit 226 using the SOH lookup table for each SOC section to estimate a final SOH value. This will be represented by the following Equation.

FINAL SOH=$A \times$SOH$_{OPERATION}$+$(1-A) \times$SOH$_{table}$ [Equation 14]

Here, the SOH$_{operation}$ represents the first SOH, SOH$_{table}$ represents the second SOH, and A value represents a value changed depending on temperature.

The A value is values which are tabulated by a database storing temperature information through experiments. This will be shown as following Table.

TABLE 1

| Temperature | A value |
|---|---|
| −15 | a |
| −10 | b |
| 0 | c |
| 10 | d |
| 25 | e |
| 35 | f |
| 45 | g |

Figure 3A:
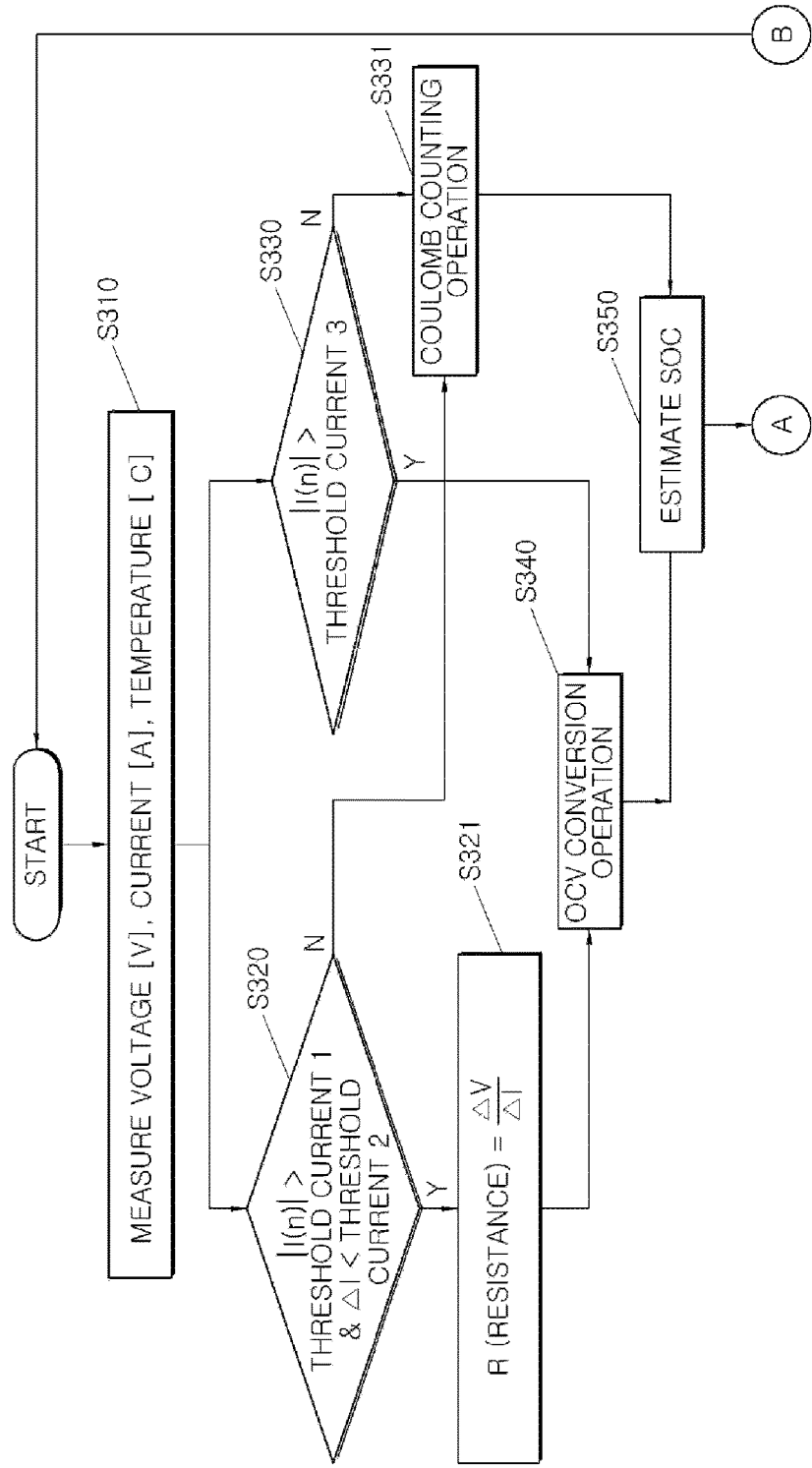
FIGS. 3A and 3B are flow charts illustrating a process of estimating a deterioration of a battery pack in accordance with an embodiment of the present invention.
Figure 3B:
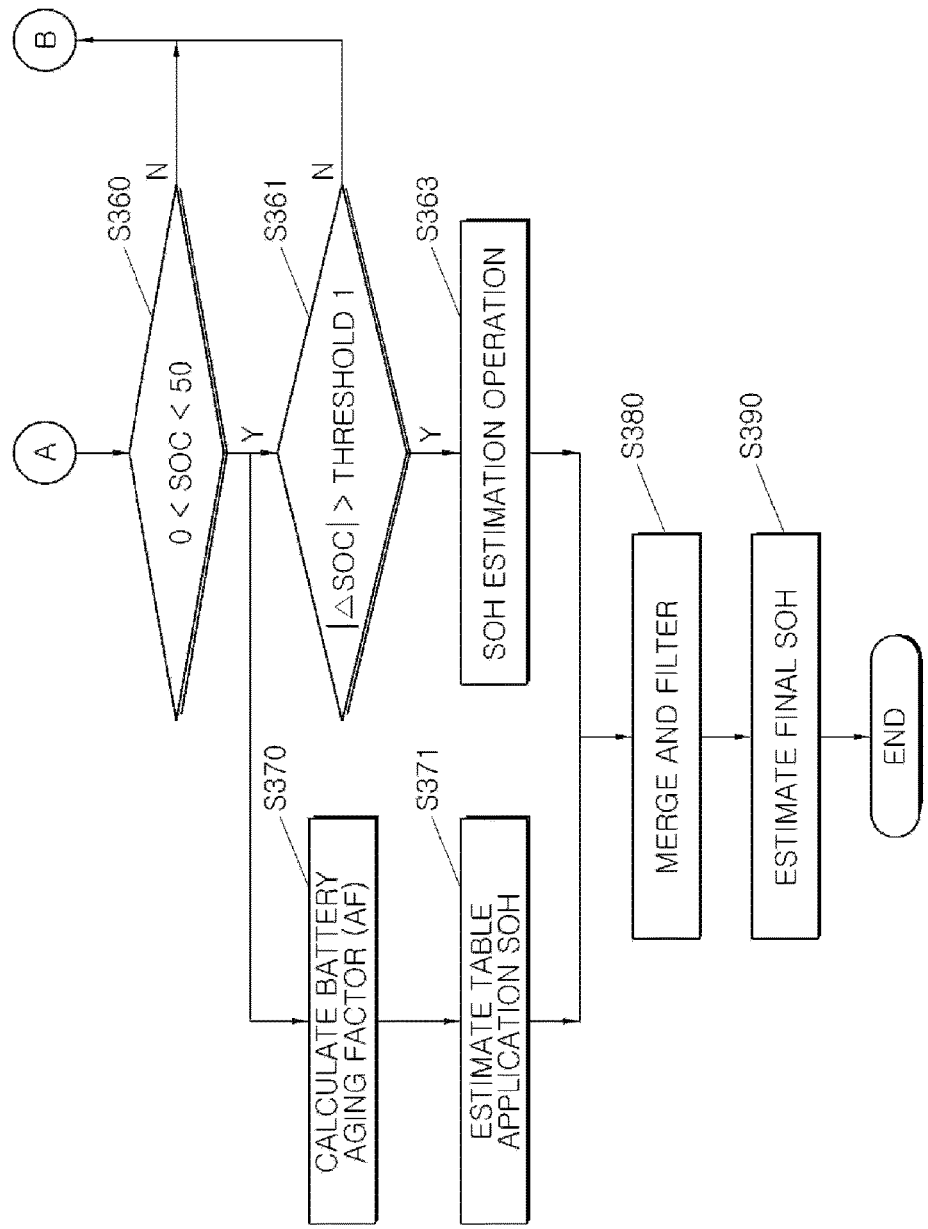

FIGS. 3A and 3B are flow charts illustrating a process of estimating a deterioration of a battery pack in accordance with an embodiment of the present invention. Referring to FIG. 3A, the state information is sensed by sensing the state of the battery pack (step S310).

As the sensing result, when I(n)<threshold current value 1 and ΔI<threshold current value 2 are satisfied, the resistance R is calculated and the conversion operation into the OCV is performed (steps S320 and S321).

In step S320, when I(n)<threshold current value 1 and ΔI<threshold current value 2 are not satisfied, the SOC is estimated by using the coulomb counting scheme (steps S331 and S350).

Further, as the sensing result, in the case of I(n)>threshold current value 3, the SOC is estimated by performing the conversion operation into the OCV and using the operated OCV (steps S330, S340, and S350).

In step S330, when I(n)>threshold current value 3 is not satisfied, the SOC is estimated by using the coulomb counting scheme (steps S331 and S350).

It is determined whether the estimated SOC is equal to or more than 0 and less than 50, and if it is not satisfied that the estimated SOC is equal to or more than 0 and less than 50, steps S310 to S350 are repeatedly performed.

Referring to FIG. 3B, unlike this, if it is determined that the estimated SOC is equal to or more than 0 and less than 50, it is confirmed whether ASOC is larger than the threshold value 1 (steps S360 and S361). As the confirmation result, if it is determined that the ASOC is larger than the threshold value 1, the SOH is estimated using the estimated SOC (step S363).

At the same time, if it is determined that the estimated SOC is equal to or more than 0 and less than 50, the battery aging factor (AF) is calculated and the calculated battery aging factor (AF) is applied to the SHO lookup table for each SOC section to calculate the first SOH (steps S370 and S371).

Next, the first SOH and the second SOH are merged with each other and filtered to estimate the final SOH (steps S380 and S390).

FIG. 4 is a graph illustrating the conversion of the open circuit voltage (OCV) into the state of charge (SOC) based on the open circuit voltage (OCV) table in accordance with the embodiment of the present invention.

FIG. 5 is a graph illustrating the OCV value which is changed in the specific SOC section depending on the deterioration of capacity in accordance with the embodiment of the present invention. FIG. 5 illustrates the graph of the OCVs for each SOC depending on the deterioration of capacity. In accordance with the graph, when the battery aging occurs, the battery OCV value is changed in the SOC-OCV variable section 510 depending on the battery aging.

FIG. 6 is a graph illustrating variables of the deterioration of the battery which are defined in the SOC-OCV variable section in accordance with the embodiment of the present invention. Referring to FIG. 6, the deterioration of the battery is represented as an arrow within the SOC section of 0 to 50%. That is, the deterioration is severe from right to left.

Figure 7:
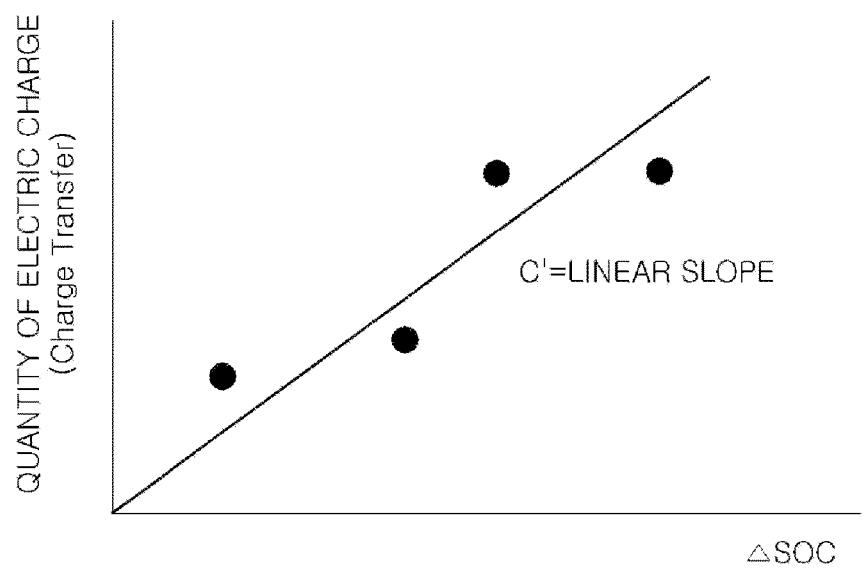
FIG. 7 is a graph illustrating deteriorating battery capacity which is calculated using a least mean square scheme in accordance with an embodiment of the present invention.

FIG. 7 is a graph illustrating the deteriorating battery capacity which is calculated using the least mean square scheme in accordance with the embodiment of the present invention. Referring to FIG. 7, the linear slope C' is calculated by using a relationship between the charge transfer and the ASOC. The linear slope becomes the deterioration battery capacity.

Figure 8:
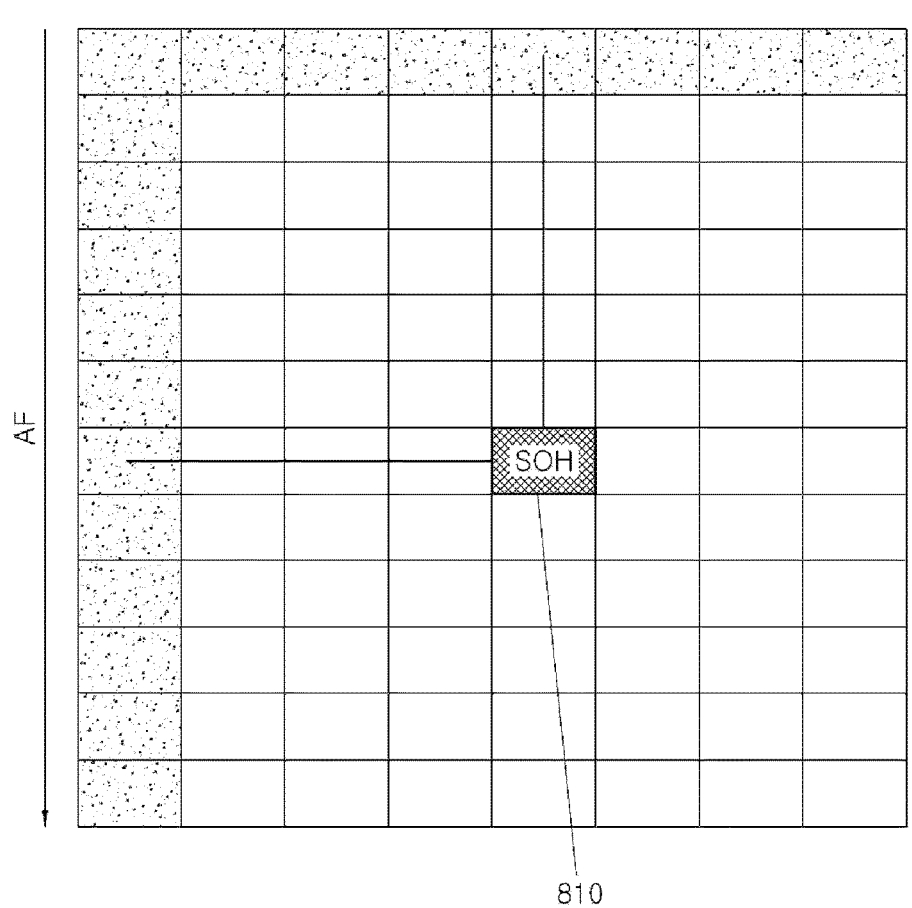
FIG. 8 is a diagram illustrating a concept of estimating a state of health (SOH) using an example of a state of health (SOH) lookup table for each SOC section in accordance with an embodiment of the present invention.

FIG. 8 is a diagram illustrating a concept of estimating the state of health (SOH) using the example of a state of health (SOH) lookup table for each SOC section in accordance with the embodiment of the present invention. Referring to FIG. 8, an SOH 810 is estimated by applying the battery aging factor (AF) value to the SOH lookup table for each SOC section.

In accordance with the embodiments of the present invention, it is possible to exclude a necessity of a large amount of test results for tabulation by estimating the state of charge (SOC) and the battery aging factor using the current, the voltage, and/or the temperature and performing the state of health (SOH) estimation operation and the table application estimation operation using Equation.

Further, it is possible to minimize the errors of the battery state of health by calculating the final SOH to which the operation and/or experiment value is applied by performing the filtering using the SOH estimation operation and the table application estimation operation.

The foregoing embodiments are only examples to allow a person having ordinary skill in the art to which the present invention pertains (hereinafter, referred to as "those skilled in the art") to easily practice the present invention. Accordingly, the present invention is not limited to the foregoing embodiments and the accompanying drawings, and therefore, a scope of the present invention is not limited to the foregoing embodiments. Accordingly, it will be apparent to those skilled in the art that substitutions, modifications and variations can be made without departing from the spirit and scope of the invention as defined by the appended claims and can also belong to the scope of the present invention.

What is claimed is:

1. An apparatus for estimating a state of health (SOH) of a battery, the apparatus comprising:
    a state information sensing unit configured to sense a state of the battery to generate state information;
    a conversion operation unit configured to convert the state information to an open circuit voltage (OCV) and further configured to estimate a state of charge (SOC) value using the converted OCV;
    a first SOH estimation operation unit configured to estimate a first state of health (SOH) value using the estimated SOC value;
    a battery aging factor calculation unit configured to calculate a battery aging factor using the estimated SOC value;
    a second SOH operation unit configured to calculate a second SOH value using the calculated battery aging factor and a predetermined lookup table; and
    a filtering unit configured to to generate a third SOH value using the following equation:

FINAL SOH=$A \times SOH_{OPERATION}+(1-A) \times SOH_{table}$, wherein "FINAL SOH" represents the third SOH value, "$SOH_{operation}$" represents the first SOH, "$SOH_{table}$" represents the second SOH, and "A" represents a value that changes depending upon temperature of the battery.

2. The apparatus of claim 1, wherein the state information includes voltage, temperature, and current.

3. The apparatus of claim 1, wherein the SOC value is estimated by converting the OCV into the SOC value using a predetermined SOC-OCV lookup table.

4. The apparatus of claim 1, wherein the SOC value is estimated by converting the OCV into the SOC value using a coulomb counting scheme and the coulomb counting scheme represents a value obtained by integrating a current value input by a unit time and then dividing the integrated current value by the total battery capacity as the SOC value fluctuates for a unit time.

5. The apparatus of claim 1, wherein the first estimation operation unit is configured to estimate the SOH value using a charge transfer and an SOC change value for a predetermined time by using a change in the SOC value depending on a current behavior at the time of charging and discharging of the battery pack.

6. The apparatus of claim 5, wherein the first estimation operation unit is further configured to calculate the first SOH value by assigning a threshold condition to the primarily estimated SOH value and applying a least mean square scheme to the SOH satisfying the threshold condition.

7. The apparatus of claim 6, wherein the first SOH value is estimated as a percentage divided by an initial battery capacity at a linear slope calculated by the least mean square scheme.

8. The apparatus of claim 1, wherein the predetermined lookup table is an SOH lookup table for each SOC value section.

9. The apparatus of claim 1, wherein A represents one selected from values which are tabulated by a database storing temperature information through experiments.

10. A method of estimating a state of health (SOH) of a battery pack, comprising:
    sensing voltage and current of the battery pack;
    estimating an open circuit voltage (OCV) using the sensed voltage and current;
    estimating a state of charge (SOC) value using the computed OCV;
    estimating a first state of health (SOH) value using the estimated SOC value and a SOH estimating formula;
    estimating a battery aging factor using the estimated SOC value;
    applying the calculated battery aging factor to a predetermined lookup table for acquiring a second SOH value; and
    estimating a third SOH value using the following equation:

FINAL SOH=$A \times SOH_{OPERATION}+(1-A) \times SOH_{table}$, wherein "FINAL SOH" represents the third SOH value, "$SOH_{operation}$" represents the first SOH, "$SOH_{table}$" represents the second SOH, and "A" represents a value that changes depending upon temperature of the battery.

11. The method of claim 10, further comprising sensing a temperature of the battery pack to be used when estimating the SOC value.

12. The method of claim 10, wherein the SOC value is acquired by converting the OCV into the SOC value using a predetermined SOC-OCV lookup table.

13. The method of claim 12, wherein the SOC is estimated by converting the OCV into the SOC value using a coulomb counting scheme and the coulomb counting scheme represents a value obtained by integrating a current value input by a unit time and then dividing the integrated current value by the total battery capacity as the SOC value fluctuates for a unit time.

14. The method of claim 10, wherein in the estimating of the first state of charge, the SOH value is primarily estimated using a charge transfer and an SOC change value for a predetermined time by using a change in the SOC value depending on a current behavior at the time of charging and discharging of the battery pack.

15. The method of claim 14, wherein in the first state of charge, the first SOH value is calculated by assigning a threshold condition to the primarily estimated SOH value and applying a least mean square scheme to the SOH value satisfying the threshold condition.

16. The method of claim 15, wherein the first SOH value is estimated by being divided by an initial battery capacity at a linear slope calculated by the least mean square scheme to be obtained as a percentage.

17. The method of claim 10, wherein the predetermined lookup table is an SOH lookup table for each SOC value section.

18. The method of claim 10, wherein A represents one selected from values which are tabulated by a database storing temperature information through experiments.

* * * * *